(12) United States Patent
Snyder

(10) Patent No.: US 7,312,616 B2
(45) Date of Patent: Dec. 25, 2007

(54) SUCCESSIVE APPROXIMATE CAPACITANCE MEASUREMENT CIRCUIT

(75) Inventor: Warren S. Snyder, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/337,272

(22) Filed: Jan. 20, 2006

(65) Prior Publication Data
US 2007/0170931 A1 Jul. 26, 2007

(51) Int. Cl.
*G01R 27/26* (2006.01)

(52) U.S. Cl. ............... 324/658; 324/678; 324/686

(58) Field of Classification Search ......... 324/658, 324/649, 600, 661, 686, 519, 677, 678, 548, 324/76.11, 158.1; 323/288, 282; 327/538
See application file for complete search history.

(56) References Cited

U.S. PATENT DOCUMENTS

| | | | |
|---|---|---|---|
| 4,283,713 A | 8/1981 | Philipp | |
| 4,438,404 A | 3/1984 | Philipp | |
| 4,475,151 A | 10/1984 | Philipp | |
| 4,497,575 A | 2/1985 | Philipp | |
| 4,736,097 A | 4/1988 | Philipp | |
| 4,773,024 A | 9/1988 | Faggin et al. | |
| 4,802,103 A | 1/1989 | Faggin et al. | |
| 4,876,534 A | 10/1989 | Mead et al. | |
| 4,879,461 A | 11/1989 | Philipp | |
| 4,935,702 A | 6/1990 | Mead et al. | |
| 4,953,928 A | 9/1990 | Anderson et al. | |
| 4,962,342 A | 10/1990 | Mead et al. | |
| 5,049,758 A | 9/1991 | Mead et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,095,284 A | 3/1992 | Mead | |
| 5,097,305 A | 3/1992 | Mead et al. | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |

(Continued)

OTHER PUBLICATIONS

Cypress Semiconductor Corporation, "CY8C21×34 Data Sheet," CSR User Module, CSR V.1.0, Oct. 6, 2005, pp. 1-36.

(Continued)

*Primary Examiner*—Andrew H. Hirshfeld
*Assistant Examiner*—Hoai-An D. Nguyen
(74) *Attorney, Agent, or Firm*—Blakely, Sokoloff, Taylor & Zafman LLP

(57) ABSTRACT

A capacitance measurement circuit includes a current source, a switch, and a comparator. The current source is coupled to drive a current through a circuit node. The switch is coupled to the circuit node to switch the current into a device under test ("DUT") capacitor. The comparator includes first and second input ports. The comparator is coupled to compare a first voltage received on the first input port against a reference voltage received on the second input port. The first voltage is related to the current driven through the circuit node, a frequency at which the switch is switched, and a capacitance of the DUT capacitor.

19 Claims, 6 Drawing Sheets

U.S. PATENT DOCUMENTS

| | | |
|---|---|---|
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,289,023 A | 2/1994 | Mead |
| 5,303,329 A | 4/1994 | Mead et al. |
| 5,305,017 A | 4/1994 | Gerphide |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,374,787 A | 12/1994 | Miller et al. |
| 5,381,515 A | 1/1995 | Platt et al. |
| 5,384,467 A | 1/1995 | Plimon et al. |
| 5,408,194 A | 4/1995 | Steinbach et al. |
| 5,488,204 A | 1/1996 | Mead et al. |
| 5,495,077 A | 2/1996 | Miller et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,629,891 A | 5/1997 | LeMoncheck et al. |
| 5,648,642 A | 7/1997 | Miller et al. |
| 5,682,032 A | 10/1997 | Philipp |
| 5,694,063 A * | 12/1997 | Burlison et al. ............... 327/50 |
| 5,730,165 A | 3/1998 | Philipp |
| 5,757,368 A | 5/1998 | Gerpheide et al. |
| 5,763,909 A | 6/1998 | Mead et al. |
| 5,767,457 A | 6/1998 | Gerpheide et al. |
| 5,796,183 A | 8/1998 | Hourmand |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,914,465 A | 6/1999 | Allen et al. |
| 5,914,708 A | 6/1999 | LaGrange et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,969,513 A * | 10/1999 | Clark .......................... 323/282 |
| 6,023,422 A | 2/2000 | Allen et al. |
| 6,028,271 A | 2/2000 | Gillespie et al. |
| 6,028,959 A | 2/2000 | Wang et al. |
| 6,097,432 A | 8/2000 | Mead et al. |
| 6,148,104 A | 11/2000 | Wang et al. |
| 6,185,450 B1 | 2/2001 | Seguine et al. |
| 6,188,228 B1 | 2/2001 | Philipp |
| 6,188,391 B1 | 2/2001 | Seely et al. |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,280,391 B1 | 8/2001 | Olson et al. |
| 6,288,707 B1 | 9/2001 | Philipp |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,377,009 B1 | 4/2002 | Philipp |
| 6,380,929 B1 | 4/2002 | Platt |
| 6,380,931 B1 | 4/2002 | Gillespie et al. |
| 6,414,671 B1 | 7/2002 | Gillespie et al. |
| 6,430,305 B1 | 8/2002 | Decker |
| 6,441,073 B1 | 8/2002 | Tanaka et al. |
| 6,452,514 B1 | 9/2002 | Philipp |
| 6,457,355 B1 | 10/2002 | Philipp |
| 6,466,036 B1 | 10/2002 | Philipp |
| 6,473,069 B1 | 10/2002 | Gerpheide |
| 6,489,899 B1 | 12/2002 | Ely et al. |
| 6,498,720 B2 | 12/2002 | Glad |
| 6,499,359 B1 | 12/2002 | Washeleski et al. |
| 6,522,128 B1 | 2/2003 | Ely et al. |
| 6,523,416 B2 | 2/2003 | Takagi et al. |
| 6,534,970 B1 | 3/2003 | Ely et al. |
| 6,535,200 B2 | 3/2003 | Philipp |
| 6,570,557 B1 | 5/2003 | Westerman et al. |
| 6,587,093 B1 | 7/2003 | Shaw et al. |
| 6,610,936 B2 | 8/2003 | Gillespie et al. |
| 6,624,640 B2 * | 9/2003 | Lund et al. ................. 324/678 |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 * | 1/2004 | Shimizu ...................... 324/658 |
| 6,705,511 B1 | 3/2004 | Dames et al. |
| 6,714,817 B2 | 3/2004 | Daynes et al. |
| 6,730,863 B1 | 5/2004 | Gerpheide et al. |
| 6,750,852 B2 | 6/2004 | Gillespie et al. |
| 6,788,221 B1 | 9/2004 | Ely et al. |
| 6,798,218 B2 | 9/2004 | Kasperkovitz |
| 6,809,275 B1 | 10/2004 | Cheng et al. |
| 6,856,433 B2 | 2/2005 | Hatano et al. |
| 6,873,203 B1 | 3/2005 | Latham, II et al. |
| 6,888,538 B2 | 5/2005 | Ely et al. |
| 6,893,724 B2 | 5/2005 | Lin et al. |
| 6,969,978 B2 * | 11/2005 | Dening ....................... 323/282 |
| 6,975,123 B1 * | 12/2005 | Malang et al. ............... 324/658 |
| 7,119,550 B2 | 10/2006 | Kitano et al. |
| 2002/0063688 A1 | 5/2002 | Shaw et al. |
| 2002/0191029 A1 | 12/2002 | Gillespie et al. |
| 2003/0025679 A1 | 2/2003 | Taylor et al. |
| 2003/0062889 A1 | 4/2003 | Ely et al. |
| 2003/0063428 A1 | 4/2003 | Nishi |
| 2003/0080755 A1 * | 5/2003 | Kobayashi ................... 324/658 |
| 2003/0156098 A1 | 8/2003 | Shaw et al. |
| 2003/0160808 A1 | 8/2003 | Foote et al. |
| 2003/0183864 A1 | 10/2003 | Miyazawa |
| 2003/0183884 A1 | 10/2003 | Miyazawa |
| 2003/0184315 A1 * | 10/2003 | Eberlein ..................... 324/658 |
| 2004/0169594 A1 | 9/2004 | Ely et al. |
| 2004/0178997 A1 | 9/2004 | Gillespie et al. |
| 2004/0252109 A1 | 12/2004 | Trent, Jr. et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2006/0032680 A1 | 2/2006 | Elias et al. |
| 2006/0097991 A1 | 5/2006 | Hotelling et al. |
| 2006/0113974 A1 * | 6/2006 | Kan et al. .................... 323/282 |
| 2006/0164142 A1 * | 7/2006 | Stanley ....................... 327/172 |

2006/0273804 A1* 12/2006 Delorme et al. ............ 324/658

OTHER PUBLICATIONS

Chapweske, Adam, "The PS/2 Mouse Interface," PS/2 Mouse Interfacing, 2001.

Sedra, Adel S. et al., "Microelectronic Circuits," 3rd Edition, Oxford University Press, pp. xiii-xx and 861-883, 1991.

Van Ess, David, "Simulating a 555 Timer with PSoC™," Cypress Semiconductor Corporation, Application Note AN2286, pp. 1-10, May 19, 2005.

Cypress Semiconductor Corporation, "FAN Controller CG6457AM and CG6462AM," PSoC™ Mixed-Signal Array Preliminary Data Sheet, pp. 1-25, May 24, 2005.

Cypress Semiconductor Corporation, "PsoC Mixed-Signal Controllers," Product Description, pp. 1-2, http://www.cypress.com/portal/server.pt?space=CommunityPage&control=SetCommunity&CommunityID=209&PageID=215&gid=13&fid=24&category=false. (Sep. 27, 2005).

Cypress Semiconductor Corporation, "Cypress Introduces PSoC(TM)-Based Capacitive Touch Sensor Solution", Cypress Press Release, May 31, 2005, http://www.cypress.com/portal/server.pt?space=CommunityPage&control=SetCommunity&CommunityID=208&PageID=218&DirectoryID=661552 (Retrieved on Feb. 5, 2007).

Seguine, Ryan, "Layout Guidelines for PSoC™ CapSense™," Cypress Semiconductor Corporation, Application Note AN2292, pp. 1-10, Jul. 22, 2005.

Lee, Mark, "EMC Design considerations for PsoC™ CapSense™ Applications," Cypress Semiconductor Corporation, Application Note AN2318, pp. 1-6, Sep. 16, 2005.

Cypress Semiconductor Corporation, "Release Notes srn017," pp. 1-3, Jan. 24, 2007.

Cypress Semiconductor Corporation, "PSoC® CY8C20x34 Technical Reference Manual (TRM)," PSoC CY8C20x34 TRM, Version 1.0, pp. 1-218, 2006.

* cited by examiner
SUCCESSIVE APPROXIMATE CAPACITANCE MEASUREMENT CIRCUIT

TECHNICAL FIELD

This disclosure relates generally to electronic circuits, and in particular but not exclusively, relates to capacitance measurement circuits.

BACKGROUND INFORMATION

Capacitance sensors are used to implement a variety of useful functions including touch sensors (e.g., touch pad, touch dial, touch wheel, etc.), determining the presence of an object, accelerometers, and other functions. FIG. 1 illustrates a conventional capacitance sensor 100 including three switches 105 with control terminals φ0, φ1, and φ2, an integrating capacitor 110 having a capacitance $C_{INT}$, and an analog to digital ("ADC") converter 115. Capacitance sensor 100 may be used to sense changes in capacitance on a device under test ("DUT") capacitor 120 having a changing capacitance $C_{DUT}$.

During operation, capacitance sensor 100 operates as follows to sense capacitance changes on DUT capacitor 120. First, integrating capacitor 110 is discharged to a ground potential by asserting control terminal φ0 to open circuit switch SW0 and by asserting control terminal φ1 to close circuit switch SW1. Once discharged to ground, integrating capacitor 110 is disconnected from ground by asserting φ1 to open switch SW1. Then, DUT capacitor 120 is charged to the supply voltage VS by asserting φ0 to open circuit switch SW0 and asserting φ2 to close circuit switch SW2. Once DUT capacitor 120 charges to the supply voltage VS, the charge on DUT capacitor 120 is transferred onto integrating capacitor 110 and distributed between the two capacitors. Charge transfer occurs by asserting φ1 and φ2 to open circuit switches SW1 and SW2, respectively, and asserting φ0 to close circuit switch SW0.

The above stages of charging DUT capacitor 120 and transferring the charge onto integrating capacitor 110 are repeated a fixed number times causing the voltages of nodes N1 and N2 to ramp with time as illustrated in line graphs 130 and 135, respectively. After a fixed number of consecutive charging stages and charge transferring stages, ADC converter 115 samples the final voltage on node N2. The capacitance $C_{DUT}$ is determined based on the output of ADC converter 115 and is proportional to the voltage at node N2 after the final charge transfer stage.

Capacitance sensor 100 functions properly if $C_{INT}$ is considerably larger than $C_{DUT}$ (e.g., 1000× larger) so as to average out noise on the supply voltage VS. However, using a large $C_{INT}$ value requires a large number of charge transfer cycles to achieve a good capacitance measurement of $C_{DUT}$. Therefore, capacitance sensor 100 may have a relatively slow measurement time. Furthermore, capacitance sensor 100 uses ADC 115 which is a relatively complex and expensive component.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of operation for a capacitance measurement circuit are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
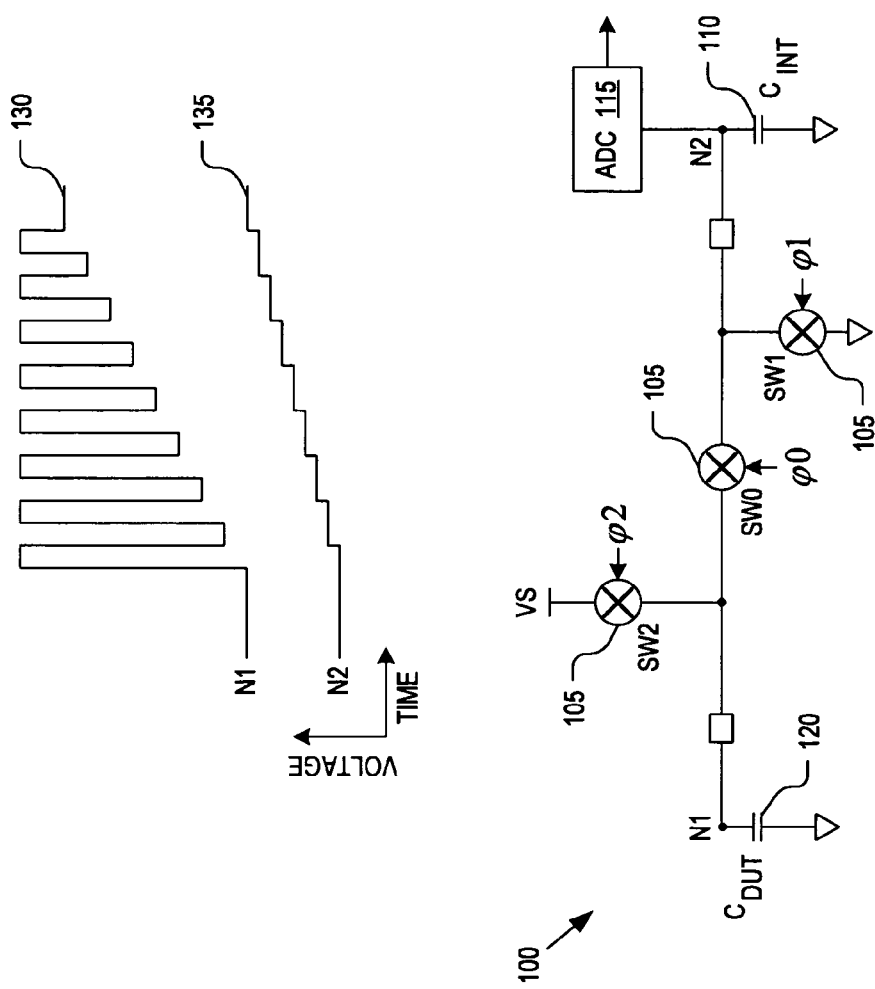
FIG. 1 is a block diagram illustrating a conventional capacitance sensor.
Figure 2:
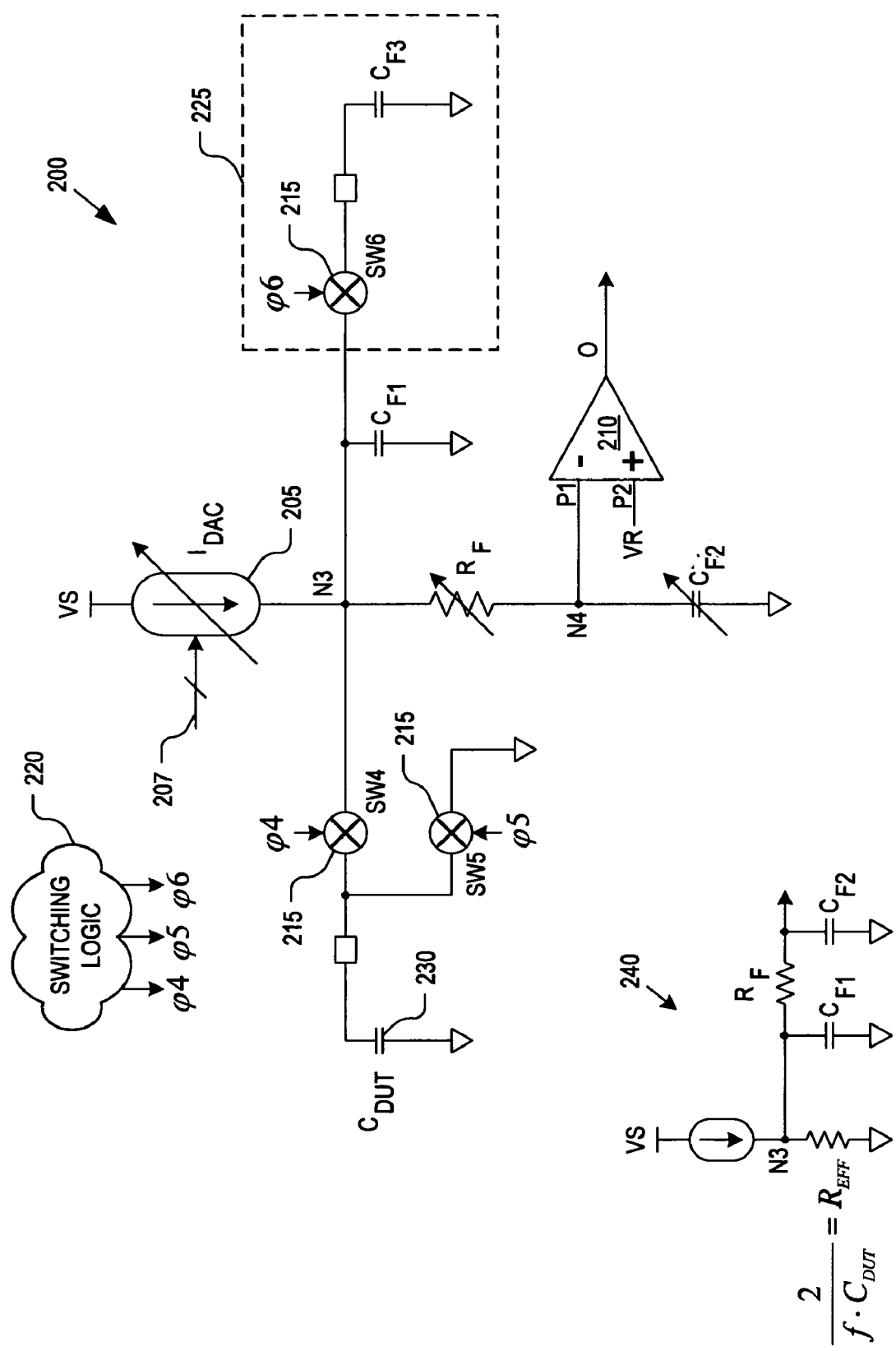
FIG. 2 is a circuit diagram illustrating a capacitance measurement circuit, in accordance with an embodiment of the invention.

FIG. 2 is a circuit diagram illustrating a capacitance measurement circuit 200, in accordance with an embodiment of the invention. The illustrated embodiment of capacitance measurement circuit 200 includes a current source 205, a comparator 210, switches 215, switching logic 220, filter capacitors CF1 and CF2, a resistor RF, and a switchable filter circuit 225. The illustrated embodiment of filter circuit 225 includes a switch SW6 and a capacitor CF3. Capacitance measurement circuit 200 may be used to measure the absolute capacitance $C_{DUT}$ of a DUT capacitor 230 or to measure/monitor capacitance changes $\Delta C_{DUT}$ of DUT capacitor 230.

The components of capacitance measurement circuit 200 are coupled as follows. Current source 205 is coupled to a node N3 to drive a current $I_{DAC}$ through node N3. Switching logic 220 is coupled to switches 215 to selectively open and close switches 215 at a switching frequency f in a predetermined manner. As switches 215 are opened and closed in the predetermined manner, DUT capacitor 230 is continuously charged by current source 205 and discharged to a ground potential. Switching logic 220 may be logic embodied within hardware circuits or software code executed by a microcontroller or processor.

During operation, current $I_{DAC}$ is switched into DUT capacitor 230 at the switching frequency f. When current is switched into DUT capacitor 230, it has an effective resistance $R_{EFF}$ given by relation 1 below, $$R_{EFF} = \frac{2}{f \cdot C_{DUT}} \quad \text{(Relation 1)}$$

and therefore according to Ohm's Law, an effective voltage appears across DUT capacitor 230 at node N3 given by relation 2 below, $$V_{N3} = I_{DAC} \cdot R_{EFF} = I_{DAC} \cdot \frac{2}{f \cdot C_{DUT}}. \quad \text{(Relation 2)}$$

Therefore, changing either the switching frequency f or the charging current $I_{DAC}$ will cause the voltage at node N3 to change proportionally according to relation 2. As illustrated in relation 2, there are four variables ($V_{N3}$, $I_{DAC}$, f, and $C_{DUT}$). If $I_{DAC}$ and f are known or programmable values and $V_{N3}$ can be measured or successively approximated, then the absolute capacitance $C_{DUT}$ or change in capacitance $\Delta C_{DUT}$ of DUT capacitor 230 can be resolved.

In one embodiment, current source 205 is a variable current source capable of generating a selectable charging current $I_{DAC}$ in response to a select input 207. In one embodiment, select input 207 is a digital input coupled to receive a multi-bit select value (e.g., 8-bit value). Accordingly, voltage $V_{N3}$ may be made to vary either by varying the multi-bit select value on select input 207 (i.e., varying the charging current) or by varying the switching frequency f via switching logic 220.

In one embodiment, comparator 210 is a voltage comparator coupled to compare a voltage $V_{N4}$ at node N4 received on port P1 against a reference voltage VR received on port P2. Voltage $V_{N4}$ at node N4 is approximately equal to voltage $V_{N3}$ at node N3 (e.g., filtered or averaged version thereof) or otherwise related in a determinable or known manner to $V_{N3}$. When voltages $V_{N4}$ and VR crossover, comparator 210 toggles its output 'O' as an indication of the crossover event. The logic state of output 'O' is also an indication of whether $V_{N4}$ is greater than or less than VR. Accordingly by continuously adjusting either the switching frequency f and/or the charging current $I_{DAC}$, a technique of "successive approximation" may be used to iteratively approximate the value of capacitance $C_{DUT}$ by way of relation 2. The successive approximation technique sequentially adjusts the switching frequency f and/or the charging current $I_{DAC}$ after comparing $V_{N4}$ to VR to iteratively bring $V_{N4}$ closer to VR, until $V_{N3}$ in relation 2, can be substituted with the value of VR within an acceptable margin of error (note: $V_{N3} \cong V_{N4}$). With $V_{N4}$ assumed to be approximately equal to VR, relation 2 can be solved to determine $C_{DUT}$ or $\Delta C_{DUT}$.

In the illustrated embodiment, filtering capacitor $C_{F1}$ is coupled to node N3, filtering capacitor $C_{F2}$ is coupled to node N4, and resistor $R_F$ is coupled between nodes N3 and N4. Filtering capacitors $C_{F1}$ and $C_{F2}$ and resistor RF act to filter noise on node N3 and average its value over time. Filter circuit 225 provides an additional filtering function that may be enabled/disabled by appropriate assertion of φ6 to open or close switch SW6. In one embodiment, resistor $R_F$ and filtering capacitor $C_{F2}$ are variable to provide adjustable filtering having adjustable cutoff frequencies. If switching frequency f is used as the knob to adjust the effective resistance $R_{EFF}$ of DUT capacitor 230 and therefore adjust voltage $V_{N3}$ at node N3, then appropriate adjustment of $R_F$ and $C_{F2}$ can be used to tune the filtering cutoff frequency accordingly. Example components values for a $C_{DUT} \cong 10$ pF are VS≅3.3V, VR=1.30V, $C_{F1} \cong 100$ pF, $C_{F2} \cong 10$ pF, and $R_F \cong 1$ MΩ.

Circuit diagram 240 is the circuit equivalent of capacitance measurement circuit 200 about node N3 when switch SW6 is open circuited. As can be seen, filtering capacitors $C_{F1}$ and $C_{F2}$ and resistor $R_F$ form a low pass filter coupled to node N3. $R_{EFF}$ represents the effective resistance of DUT capacitor 230 switched at a frequency f. Adjustment of $C_{F2}$ and/or $R_F$ will adjust the cutoff frequency of the low pass filter illustrated in circuit diagram 240.

Figure 3:
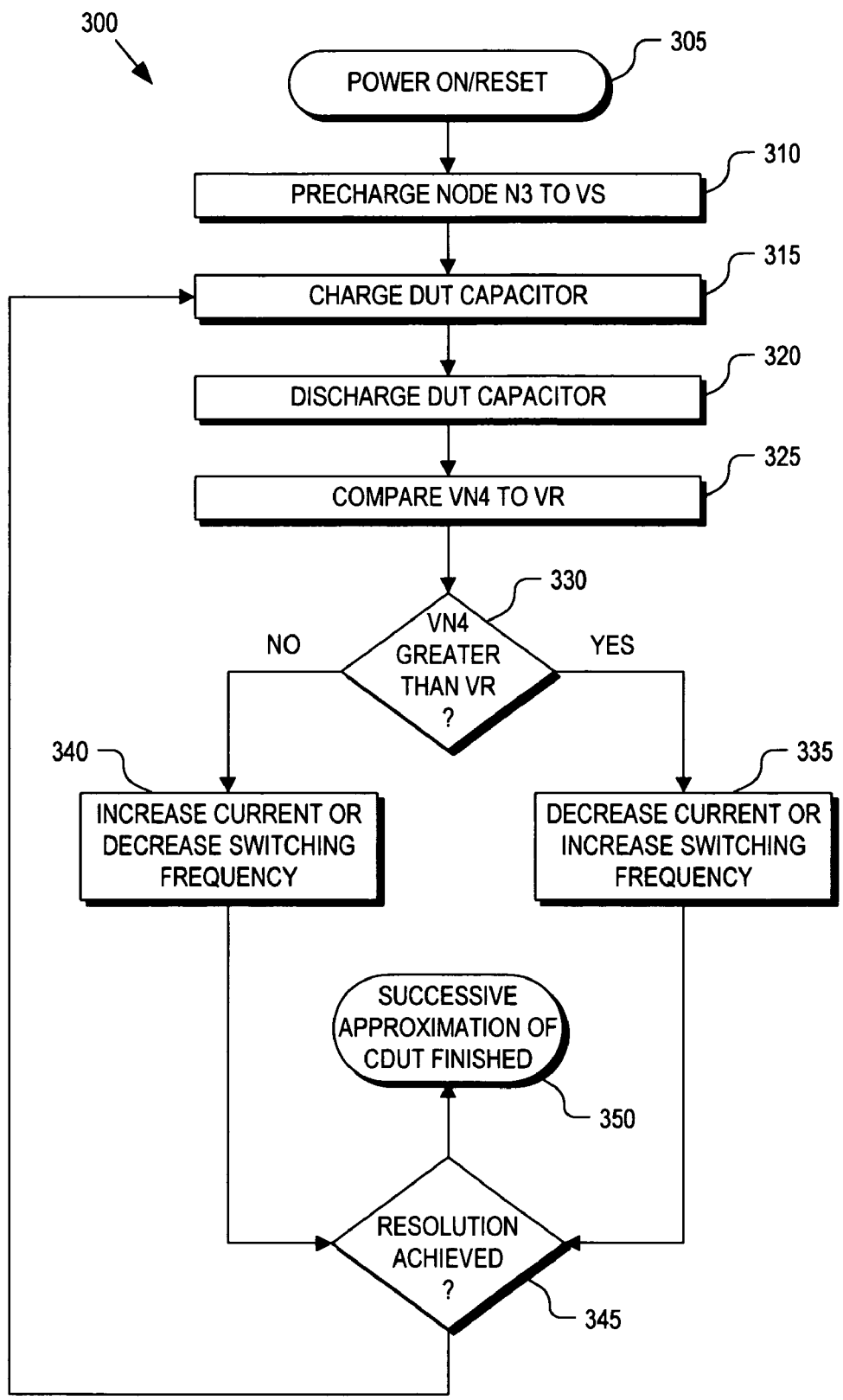
FIG. 3 is a flow chart illustrating a process of operation of a capacitance measurement circuit, in accordance with an embodiment of the invention.

FIG. 3 is a flow chart illustrating a process 300 of operation for capacitance measurement circuit 200, in accordance with an embodiment of the invention. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 305, power is asserted to capacitance measurement circuit 200 or capacitance measurement circuit 200 is reset. In a process block 310, node N3 is pre-charged. Pre-charging node N3 aids the successive approximation by providing a starting voltage that is closer to VR and therefore capacitance measurement circuit 200 achieves steady state operation quicker. In one embodiment, node N3 is precharged to the supply voltage VS.

In a process block 315, DUT capacitor 230 is charged. DUT capacitor 230 may be charged by asserting φ5 to open circuit switch SW5 and asserting φ4 to close circuit switch SW4. With switch SW4 closed circuited, current $I_{DAC}$ flows into DUT capacitor 230 from node N3. In one embodiment, current source 205 charges DUT capacitor 230 up to the supply voltage VS each charging cycle.

In a process block 320, DUT capacitor 230 is discharged. DUT capacitor 230 may be discharged by asserting φ4 to open circuit switch SW4 and asserting φ5 to close circuit switch SW5. Once switch SW5 is close circuited, charge will flow from DUT capacitor 230 into the return path voltage rail (GND) thereby discharging DUT capacitor 230. While switch SW4 is open circuited, charging current $I_{DAC}$ may be recharging filter capacitor $C_{F1}$. Accordingly, it should be understood that a portion of the charging current $I_{DAC}$ used to charge DUT capacitor 230 when switch SW4 is close circuited may be sourced from filter capacitor $C_{F1}$.

The switching frequency f and the determination of when to open and close circuit switches 215 is executed by switching logic 220. In one embodiment, switching logic 220 selects a 50% duty cycle between switches SW4 and SW5; however, other duty cycles may be used.

In a process block 325, the voltage $V_{N4}$ at node N4 is compared by comparator 210 to the reference voltage VR. Although FIG. 3 illustrates process block 325 as occurring after discharging DUT capacitor 230, it should be appreciated that process block 325 may occur prior to discharging DUT capacitor 320, occur in parallel with either/both of the discharging or charging stages, or even occur independent of the charging and discharging stages.

If the voltage $V_{N4}$ is greater than the reference voltage VR (decision block 330), then process 300 continues process block 335. In process block 335, the knob used to adjust the effective resistance $R_{EFF}$ of DUT capacitor 230 is adjusted to reduce $R_{EFF}$ and therefore reduce $V_{N4}$. $R_{EFF}$ may be reduced by decreasing charging current $I_{DAC}$ and/or increasing switching frequency f. If the voltage $V_{N4}$ is less than the reference voltage VR (decision block 330), then process 300 continues to a process block 340. In process block 340, the knob used to adjust the effective resistance $R_{EFF}$ of DUT capacitor 230 is adjusted to increase $R_{EFF}$ and therefore increase $V_{N4}$. $R_{EFF}$ may be increased by increasing charging current $I_{DAC}$ and/or decreasing switching frequency f.

After adjustment of the circuit knob (e.g., switching frequency or charging current), process 300 returns to process block 315, if the desired successive approximation resolution has not yet be achieved (decision block 345). In one embodiment, the desired resolution may be achieved after a fixed number of adjustment cycles (e.g., 8, 16, etc.). In one embodiment, the desired resolution may be achieved when the voltage difference between VR and $V_{N4}$ is measured by comparator 210 to be within a predetermined threshold. After the desired resolution (i.e., amount of acceptable deviation between $V_{N4}$ and VR) has been achieved, the current values of charging current $I_{DAC}$ and switching frequency f are plugged into relation 2 with the value of VR substituted for $V_{N3}$, and relation 2 solved to determine $C_{DUT}$ (process block 350).

In one embodiment, process 300 may be executed while only adjusting charging current $I_{DAC}$ as the sole circuit knob for manipulating $R_{EFF}$ of DUT capacitor 230. In one embodiment, process 300 may be executed while only adjusting switching frequency f as the sole circuit knob for manipulating $R_{EFF}$ of DUT capacitor 230. In one embodiment, both charging current $I_{DAC}$ and switching frequency f may be adjusted to provide greater successive approximation resolution. In alternative embodiments, the value of the reference voltage VR itself may be adjusted while maintaining voltage $V_{N4}$ at a fixed value by fixing the charging current $I_{DAC}$ and the switching frequency f In this alternative embodiment, VR would be sequentially adjusted until it approximately equaled $V_{N4}$. The final value of VR would then be substituted into relation 2 for $V_{N3}$, with the assumption that $V_{N4} \cong V_{N3}$. Furthermore, all three circuit knobs (VR, f and $I_{DAC}$) may be adjusted in turn to provide even greater flexibility and successive approximation resolution.

As mentioned above, capacitance measurement circuit 200 may also be used to monitor for a change in capacitance $\Delta C_{DUT}$ (e.g., operated as a proximity sensor). Capacitance measurement circuit 200 may be initialized using process 300 until $V_{N4}$ is substantially equal to VR. Then, a voltage margin may be added to VR. While holding switching frequency f and charging current $I_{DAC}$ steady, comparator 210 monitors the voltage at node N3. When the capacitance $C_{DUT}$ of DUT capacitor 230 changes by a predetermined amount corresponding to the voltage margin added to the reference voltage VR, output O of comparator 210 toggles indicating the event.

Figure 4:
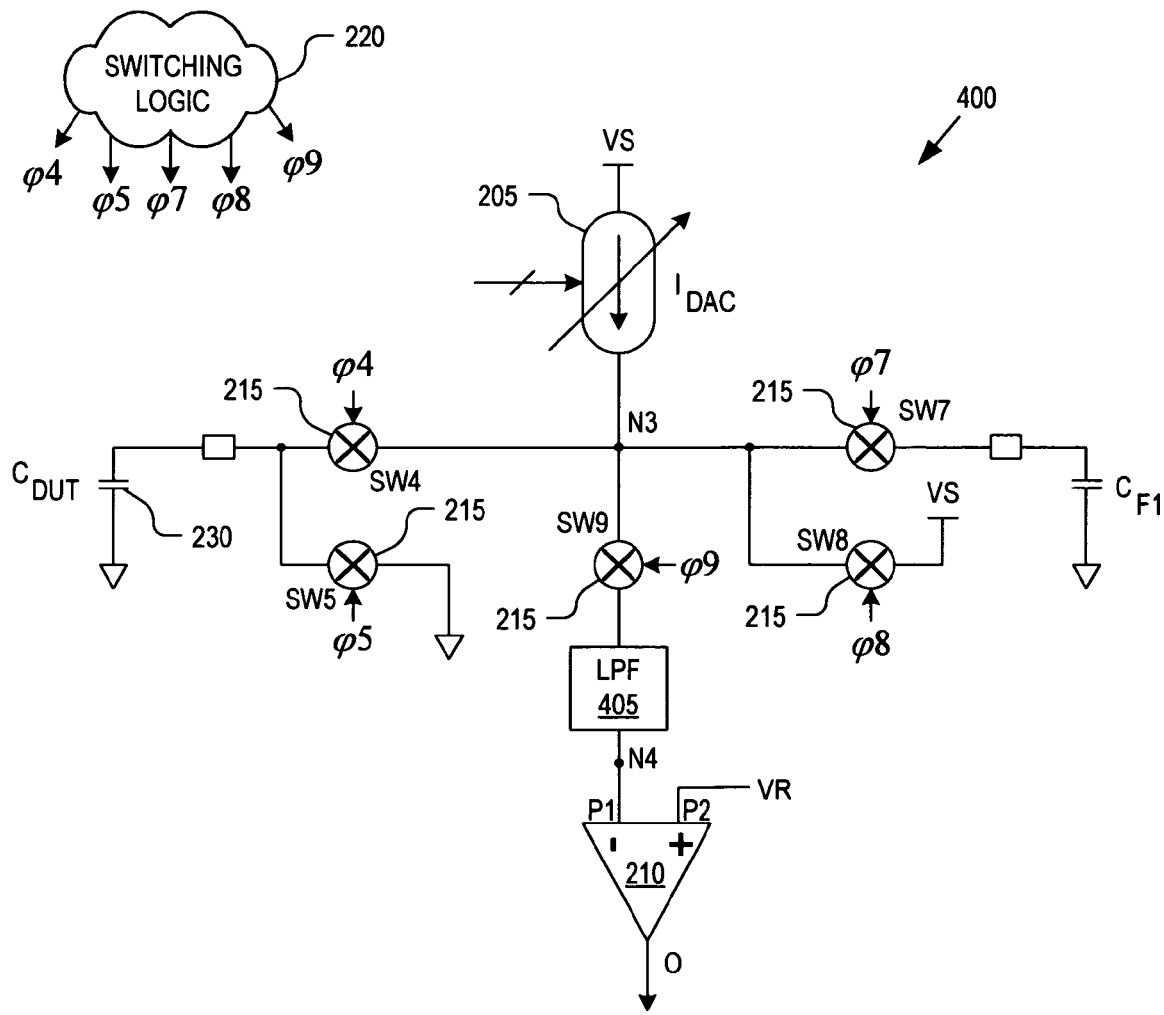
FIG. 4 is a circuit diagram illustrating a capacitance measurement circuit, in accordance with an alternative embodiment of the invention.

FIG. 4 is a circuit diagram illustrating a capacitance measurement circuit 400, in accordance with an alternative embodiment of the invention. Capacitance measurement circuit 400 is similar to capacitance measurement circuit 200, with the exceptions discussed below. Capacitance measurement circuit 400 may be used to measure the absolute capacitance $C_{DUT}$ of a DUT capacitor 230 or to measure/monitor capacitance changes $\Delta C_{DUT}$ of DUT capacitor 230 in a similar manner as discussed in process 300. The illustrated embodiment of capacitance measurement circuit 400 includes current source 205, comparator 210, switches 215 (including switches SW4, SW5, SW7, SW8, and SW9), switching logic 220, filter capacitor CF1, and a low pass filter ("LPF") 405.

LPF 405 and switch SW9 are coupled between port P1 of comparator 210 and circuit node N3. Filter 405 illustrates that a variety of filtering circuits may be used to implement the filtering and averaging functions executed by resistor $R_F$ and filtering capacitor $C_{F2}$ in FIG. 2. The filtering function implemented by LPF 405 may be adjustable or fixed. In one embodiment, the filtering function may be selectable under control of a microcontroller or even switching logic 220.

Switches SW7, SW8, and SW9 are included within capacitance measurement circuit 400 to selectively isolate node N3. Node N3 may be isolated for pre-charging, for coupling and measuring different DUT capacitors 230, for coupling a variety of different filtering capacitors $C_{F1}$, or otherwise. Switch SW8 specifically illustrates how node N3 may be pre-charged to the supply voltage VS by open circuiting switches SW4, SW7, and SW9 while close circuiting switch SW8.

Figure 5:
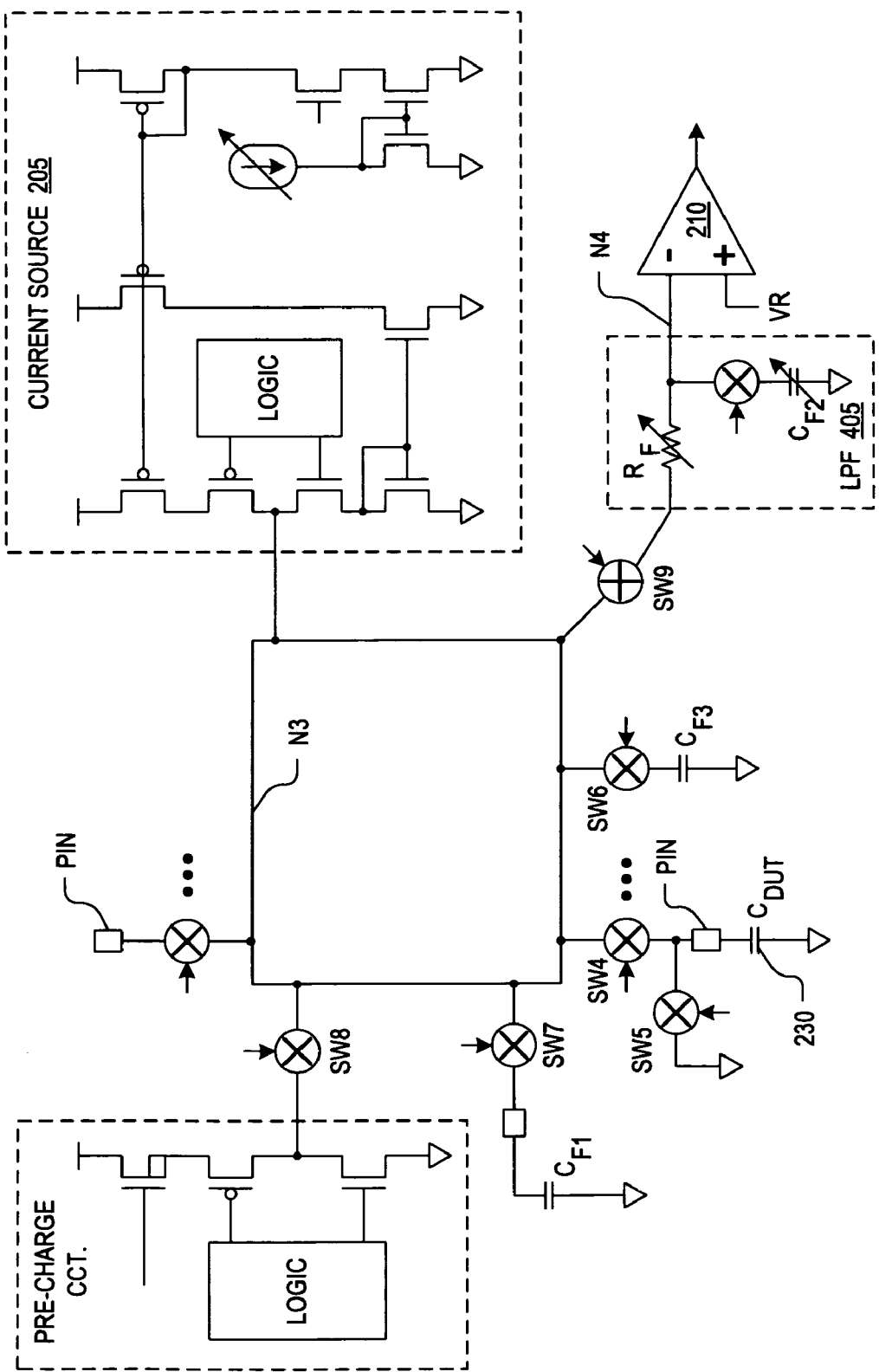
FIG. 5 is a circuit diagram illustrating a capacitance measurement circuit, in accordance with an alternative embodiment of the invention.

FIG. 5 is a circuit diagram illustrating a capacitance measurement circuit 500, in accordance with an alternative embodiment of the invention. FIG. 5 illustrates how the various subcomponents of capacitance measurement circuits 200 and 400 may be implemented in a circuit design. As illustrated, multiple switches may be coupled to node N3, which are in turn coupled to multiple pins. The multiple pins may be used to couple to a variety of different DUT capacitors 230. The switches may be selectively enabled to measure the capacitance of each DUT capacitor 230. In this manner, capacitance measurement circuit 500 may be time shared by a plurality of pins for measuring/monitoring the capacitance of multiple DUT capacitors 230 each coupled to a different pin.

Figure 6:
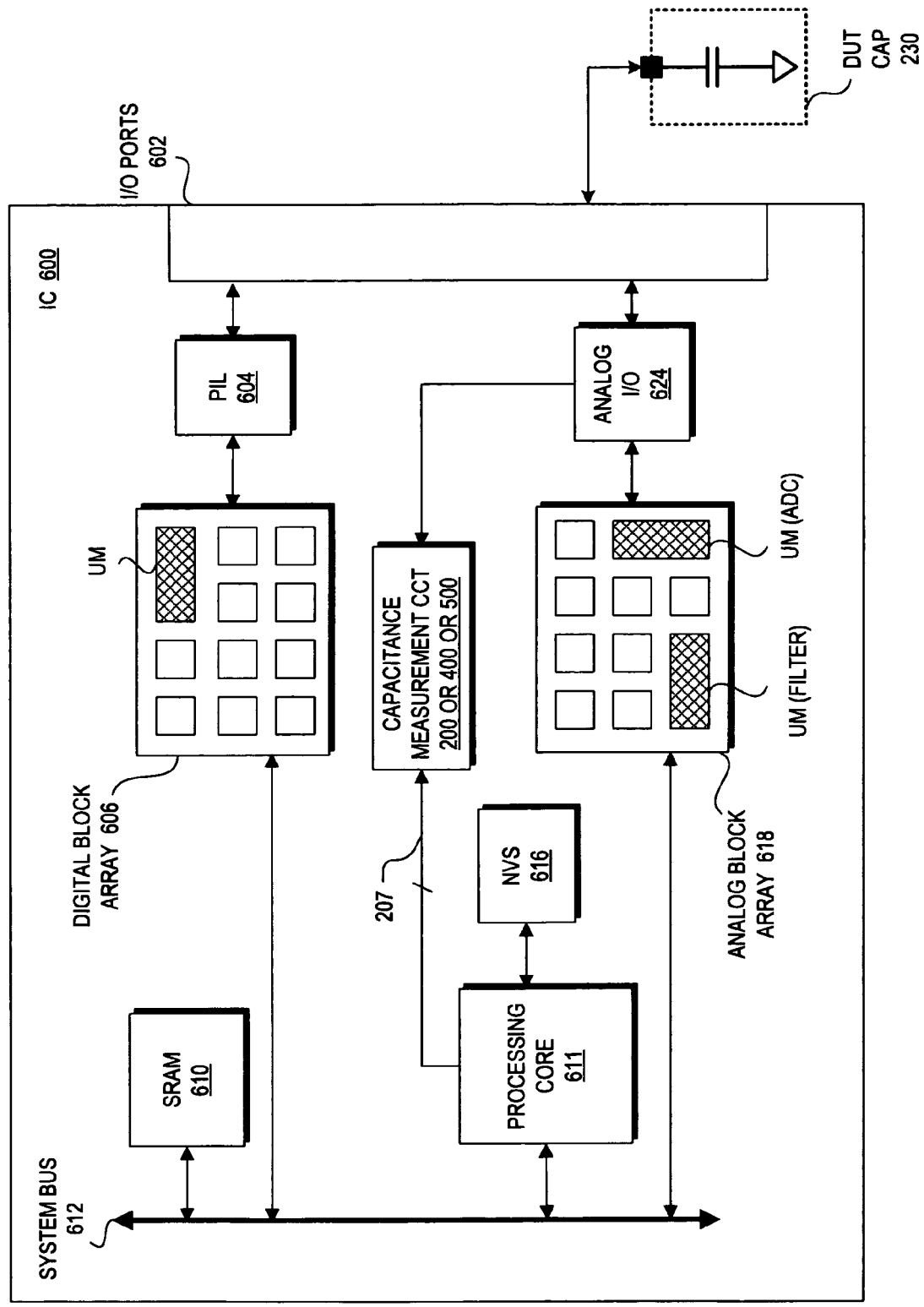
FIG. 6 illustrates a demonstrative integrated circuit for implementing an embodiment of the invention.

FIG. 6 illustrates a demonstrative integrated circuit ("IC") 600 implemented using an embodiment of capacitance measurement circuits 200, 300, or 500. IC 600 illustrates a Programmable System on a Chip (PSoC™) microcontroller by Cypress Semiconductor Corporation. The illustrated embodiment of IC 600 includes input/output ("I/O") ports 602. I/O ports 602 may be programmable. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 612.

Static Random Access Memory ("SRAM") 610 and processor 611 are also coupled to system bus 612. Processor 611 is coupled to non-volatile storage ("NVS") 616 which may be used to store firmware (e.g., control algorithms executable by processor 225 to implement process 300). In one embodiment, processor 611 implements switching logic 220.

An analog block array 618 is coupled to system bus 612. Analog block array 618 also may be configured to implement a variety of analog circuits (e.g., ADC, analog filters, comparators, current sources, etc.) using configurable UMs. Analog block array 618 is also coupled to an analog I/O unit 624 which is coupled to I/O ports 602.

As illustrated, capacitance measurement circuits 200, 300, or 500 may be incorporated into IC 600 and coupled to analog I/O unit 624 for coupling to an externally coupled DUT capacitor 230 via I/O ports 602. Various subcomponents of capacitance measurement circuits 200, 300, or 500 may be implemented with various UMs of digital clock array 606 or analog block array 618 or the subcomponents may be stand alone components.

The process described above may constitute machine-executable instructions embodied within a machine (e.g., computer) accessible medium, which when executed by a machine will cause the machine to perform the operations described herein. Additionally, the processes may be embodied within hardware, such as an application specific integrated circuit ("ASIC") or the like. A machine-accessible medium includes any mechanism that provides (i.e., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

As described above, capacitance measurement circuits 200, 300, or 500 may be incorporated into IC 600, as well as, various other integrated circuits. Descriptions of capacitance measurement circuits 200, 300, or 500 may be generated and compiled for incorporation into other integrated circuits. For example, behavioral level code describing capacitance measurement circuits 200, or portions thereof, may be generated using a hardware descriptive language, such as VHDL or Verilog, and stored to a machine-accessible medium. Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance measurement circuits 200, 300, or 500.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A capacitance measurement circuit, comprising:
   a variable current source coupled to drive a selectable current through a circuit node;
   a switch coupled to the circuit node to switch the selectable current into a device under test ("DUT") capacitor;
   a comparator including first and second input ports, the comparator coupled to compare a first voltage to be received on the first input port against a reference voltage to be received on the second input port and generate an output signal in response, wherein the first voltage is related to the selectable current driven through the circuit node, a switching frequency at which the switch is switched, and a capacitance of the DUT capacitor, wherein the switch is coupled between the first input port of the comparator and the DUT capacitor; and
   capacitance measurement logic coupled to receive the output signal from the comparator and coupled to adjust at least one of the switching frequency or a magnitude of the selectable current dependent upon the output signal.

2. The capacitance measurement circuit of claim 1, wherein the switch comprises a first switch, the capacitance measurement circuit further comprising a second switch coupled to selectively discharge the DUT capacitor when the first switch is open circuited.

3. The capacitance measurement circuit of claim 2, further comprising switching logic coupled to alternately open circuit and close circuit the first and second switches at the switching frequency.

4. The capacitance measurement circuit of claim 1, further comprising a first capacitor coupled between the circuit node and a voltage rail.

5. The capacitance measurement circuit of claim 4, further comprising:
   a second capacitor coupled between the first port of the comparator and the voltage rail; and
   a resistor coupled between the circuit node and the first port of the comparator.

6. The capacitance measurement circuit of claim 1, wherein the second input port of the comparator is coupled to receive the reference voltage independent of an output of the comparator.

7. The capacitance measurement circuit of claim 5, wherein the resistor comprises a variable resistance resistor and wherein the second capacitor comprises a variable capacitance capacitor.

8. The capacitance measurement circuit of claim 2, further comprising a low pass filter coupled between the circuit node and the first port of the comparator.

9. The capacitance measurement circuit of claim 8, further comprising:
   a first capacitor coupled to a voltage rail;
   a third switch coupled between the first capacitor and the circuit node;
   a fourth switch coupled between the low pass filter and the circuit node; and
   a fifth switch coupled between the circuit node and a second voltage rail for precharging the circuit node.

10. The capacitance measurement circuit of claim 1, further comprising a precharge switch coupled to the circuit node to selectively precharge the circuit node.

11. The capacitance measurement circuit of claim 2, wherein the first switch is coupled between the circuit node and the DUT capacitor and wherein a terminal of the second switch is coupled between the first switch and the DUT capacitor.

12. An apparatus, comprising:
    a source of current coupled to drive current through a circuit node;
    a first switch coupled to switch the current into a device under test ("DUT") capacitor;
    a second switch coupled to selectively discharge the DUT capacitor;
    a comparator including first and second ports, the first port of the comparator coupled to the circuit node independent of whether the second switch is open circuited, the comparator coupled to compare a first voltage to be received on the first port against a second voltage to be received on the second port and generate an output signal in response, wherein a change in the first voltage is related to a change in a capacitance of the DUT capacitor, wherein the first switch is coupled between the first input port of the comparator and the DUT capacitor; and
    capacitance measurement logic coupled to receive the output signal from the comparator and coupled to adjust at least one of a switching frequency of the first switch or a magnitude of the current dependent upon the output signal.

13. The apparatus of claim 12, wherein the first voltage is related to the current driven through the circuit node, a switching frequency at which the first switch is switched, and the capacitance of the DUT capacitor.

14. The apparatus of claim 12, wherein the source of current comprises a variable current source.

15. The apparatus of claim 12 further comprising a third switch coupled to selectively precharge the circuit node.

16. The apparatus of claim 12, wherein the second port of the comparator is coupled to a variable voltage source and wherein the second voltage is selectable according to the variable voltage source.

17. A machine-accessible storage medium having embodied thereon a description of an integrated circuit, the integrated circuit comprising:
   a current source coupled to drive a current through a circuit node;
   a first switch coupled between the circuit node and a device under test ("DUT") capacitor to switch the current into the DUT capacitor;
   a second switch coupled to selectively discharge the DUT capacitor when the first switch is open circuited;
   a comparator including first and second input ports, the comparator electrically coupled to the circuit node independent of whether the second switch is open circuited, the comparator to compare a first voltage to be received on the first input port against a reference voltage to be received on the second input port and generate an output signal in response, wherein the first voltage is related to the current driven through the circuit node, a switching frequency at which the switch is switched, and a capacitance of the DUT capacitor; and
   capacitance measurement logic coupled to receive the output signal from the comparator and coupled to adjust at least one of the switching frequency or a magnitude of the current dependent upon the output signal.

18. The machine-accessible medium of claim 17, wherein current source comprises a variable current source.

19. The machine-accessible medium of claim 17, wherein the integrated circuit further comprises switching logic coupled to alternately open circuit and close circuit the first and second switches at variable frequencies.

* * * * *